United States Patent [19]

Rose et al.

[11] Patent Number: 5,872,378
[45] Date of Patent: Feb. 16, 1999

[54] DUAL THIN OXIDE ESD NETWORK FOR NONVOLATILE MEMORY APPLICATIONS

[75] Inventors: Russell E. Rose, Montgomery; Robert C. Szafranski, Carmel, both of N.Y.; Steven H. Voldman, South Burlington, Vt.

[73] Assignee: International Business Machines Corporation, Armonk, N.Y.

[21] Appl. No.: 834,559

[22] Filed: Apr. 7, 1997

[51] Int. Cl.[6] .................................................. H01L 29/788
[52] U.S. Cl. ...................... 257/355; 257/324; 257/356; 257/362
[58] Field of Search ..................................... 257/324, 356, 257/361, 546, 355, 362

[56] References Cited

U.S. PATENT DOCUMENTS

| 5,017,985 | 5/1991 | Lin | 257/356 |
| 5,442,217 | 8/1995 | Mimoto | 257/361 |
| 5,508,548 | 4/1996 | Tailliet | 257/360 |
| 5,514,889 | 5/1996 | Cho et al. | 257/316 |
| 5,559,351 | 9/1996 | Takiyama | 257/324 |

*Primary Examiner*—Donald L. Monin, Jr.
*Attorney, Agent, or Firm*—Whitham, Curtis & Whitham; Eugene I. Shkurko, Esq.

[57] ABSTRACT

An Electric Static Discharge (ESD) protection network for nonvolatile memory using a high voltage dual thin oxide MOSFET. In one aspect, there is a dual oxide electric static discharge (ESD) protective network for nonvolatile memory in which ESD protection is provided using a thick oxide PFET in a thick epitaxial layer with sequence independent circuitry. The dual oxide ESD network includes a high voltage PFET ESD network for 12 V to 5 V applications as well as a low voltage PFET network 5 V to 3 V applications taking advantage of dual oxides supported by the disclosed technology. The circuit saves space, is migratable, improves reliability, and it is voltage differential independent.

6 Claims, 6 Drawing Sheets

DUAL THIN OXIDE ESD NETWORK FOR NONVOLATILE MEMORY APPLICATIONS

BACKGROUND OF THE INVENTION

1. Field of the Invention

This invention generally relates to protection for nonvolatile memory devices and, more particularly, to a dual thin oxide Electric Static Discharge (ESD) network for nonvolatile memory applications.

2. Description of the Related Art

The primary requirement of a nonvolatile memory is that it retains its information after the power is removed from the circuit. Metal Oxide Semiconductor (MOS) transistors have been used for this purpose since they have a high gate impedance to ground, and they thus are capable of long-term charge retention, provided that the oxide is of adequately high quality. One such conventional nonvolatile memory structure is a p-channel MOS field effect transistor (PFET) with a floating polysilicon gate. A more advanced memory cell design consists of a stacked polysilicon gate structure, where an upper electrode serves as the control gate.

Nonvolatile memory operation can also be based on the principle of tunneling through a thin oxide. Typically, this is done by arranging for a small portion of the floating gate to be placed over a thin oxide (100–200 Å) through which tunneling can take place. Among these type of devices are programmable read only memories (PROMS). A specific type of PROM are the electronically erasable programmable read only memory (EEPROM or $E^2$PROM) devices which can be erased on a bit-by-bit basis and reprogrammed. These nonvolatile memory devices require electrostatic discharge (ESD) protection.

Prior nonvolatile memory devices have been built using 3.3 V complementary MOS (CMOS) technology. However, a more recent demand for a 12 V power pin for nonvolatile random access memory (NVRAM) programming has arisen in the RAM industry, which has created a need for a ESD protection network that will not over voltage the NVRAM circuitry.

SUMMARY OF THE INVENTION

It is therefore a general object of the present invention to provide an ESD protection network for nonvolatile memory applications.

It is another and more specific object of the present invention to provide an ESD protection network using a high voltage PFET for 12 V NVRAM applications.

It is a further object of the present invention to provide an ESD protection network using a high voltage PFET for a NVRAM product for 12/5 V interfaces and 5/3 V interfaces, in which the ESD circuit will not cause an over voltage to the NVRAM circuitry.

According to the invention, an ESD protection network for nonvolatile memory applications is provided using a high voltage dual thin oxide MOSFET. In one particular embodiment thereof, a dual thin oxide ESD protective network for a nonvolatile memory provides ESD protection by using a dual thin oxide PFET. More specifically, the inventive dual thin oxide ESD network can include a high voltage PFET ESD network for 12 V to 5 V NVRAM applications as well as a low voltage PFET network 5 V to 3 V applications taking advantage of dual thin oxides supported by the inventive technology.

In a preferred implementation, the ESD network is applied to nonvolatile memory having a first, second, third and fourth voltage rails for respective voltages $V_{pp}$, $V_{cc}$, $V_{dd}$ and $V_{ss}$, where $V_{pp} < V_{cc} < V_{dd} < V_{ss}$. $V_{pp}$ is typically 12 V, $V_{cc}$ is typically 5 V, $V_{dd}$ is typically 3 V, and $V_{ss}$ is substrate ground. A high voltage p-channel device has a dual oxide dielectric gate structure connected to the first voltage rail and a drain connected to the second voltage rail. A high voltage bipolar PNP transistor has an emitter connected to the first voltage rail, a collector connected to the second voltage rail and a base connected to a source of the high voltage p-channel device. A series of p+ diodes are connected between the first and second voltage rails. These p+ diodes are constituted by PNP transistors. A snubber diode, comprising a PNP is connected between the second voltage rails and the PNP transistor string. This snubber diode operates to prevent Darlington amplification between the second and third voltage rails. An NFET is connected between the third and fourth voltage rails.

Other advantages of this invention are that the inventive circuit permits discharge to the 5V voltage rail without overcharging the circuit. Also, the circuit achieves $V_{pp}$ protection, and it is sequence independent. Additionally, the inventive ESD protection circuit could alternatively be implemented with a high voltage dual thin oxide NFET. Also, the inventive circuit is useful for pins on all circuits for input and output (I/O) in a NVRAM or, alternatively, in embedded core NVRAM applications such as EEPROMs. The invention is applicable to either low voltage or high voltage pins in circuits The inventive ESD circuit saves real estate (space), is migratable, improves reliability, and it is voltage differential independent.

BRIEF DESCRIPTION OF THE DRAWINGS

These and other objects and features of the invention will become more fully apparent from the several drawings and description of the preferred embodiments, in which.

DETAILED DESCRIPTION OF A PREFERRED EMBODIMENT OF THE INVENTION

Figure 1A:
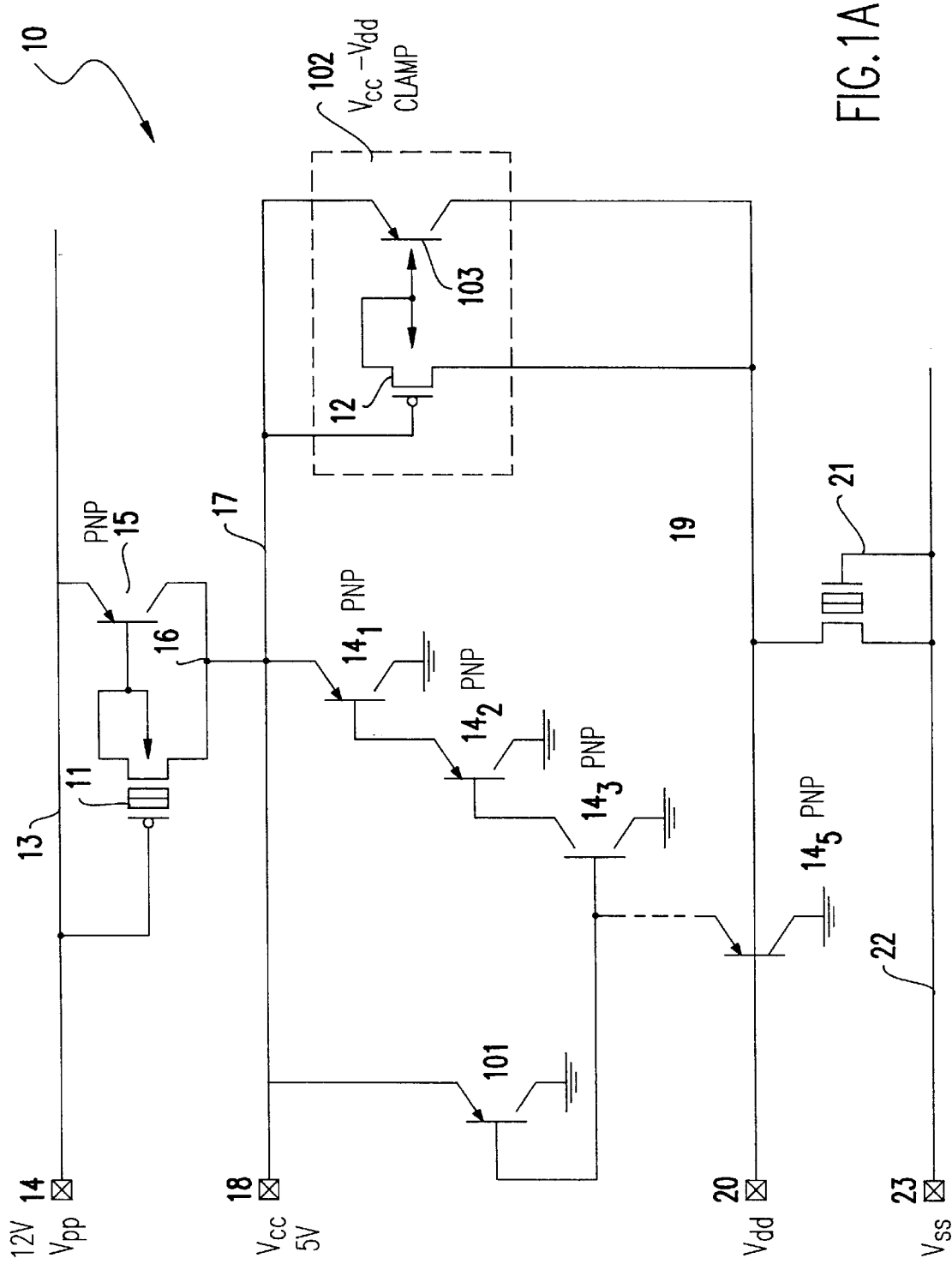
FIG. 1A is a schematic diagram of an equivalent circuit illustrating the ESD protective network for nonvolatile memory as one embodiment of the invention.

Referring now to the Figures, and more particularly to FIG. 1A, there is shown an equivalent circuit 10 for an embodiment of this invention involving an ESD protective network for nonvolatile memory. Using a dual dielectric thickness, ESD structures are integrated in the circuit 10 using both a dual thin oxide PFET 11 and a thin oxide PFET 12. The terminology "dual thin oxide" means that the gate dielectric oxide provided between the gate conductor and the channel of the FET is comprised of the thicknesses of both a sacrificial oxide layer and a gate oxide layer. The p-channel dual thin oxide field effect transistor 11 (i.e., a high voltage PFET) is utilized in a NVRAM for a high voltage ESD protection interface.

As will be explained in greater detail hereinafter under the discussion of the exemplary fabrication protocol, the high voltage PFET 11 is fabricated to have a dual thin oxide dielectric thickness that is determined as a function of the ($V_{pp}$–$V_{cc}$) voltage differential. Namely, the dual thin oxide thickness must be enlarged to a value at which the $V_{pp}$–$V_{cc}$ voltage differential does not lead to MOSFET failure in the high voltage PFET 11. The thickness of the dual thin oxide dielectric provided for PFET 11 is thus voltage stress dependent, and not process dependent. The thickness must be great enough to prevent dielectric MOSFET overstress. In the exemplified embodiment involving use of the p-channel dual thin oxide field effect transistor 11 (i.e., the high voltage PFET) in a NVRAM for a high voltage ESD protection interface with $V_{pp}$ at 12 V and $V_{cc}$ at 5 V, the dual dielectric thickness needed to satisfy the above-stated general functional criteria usually is a thickness provided between its gate conductor and channel of at least about 200 Å, or even greater. This dual thin oxide thickness is at least about twice the conventional thickness for the gate dielectric (i.e., about 100 Å) for a similar voltage differential environment.

Additionally, the high voltage PFET 11 has deep junctions placed in a thick epitaxial region at locations deeper than conventional junction depths. In the exemplary fabrication approach described in detail hereinafter, the high voltage PFET 11 is formed in N-wells formed in a thick p-epitaxial layer. The high voltage PFET of this construction is used to endow the circuit with ESD protection from high voltage input, such as between 12 V and 5 V.

Returning to FIG. 1A, the p-channel gate of PFET 11 is connected to the $V_{pp}$ voltage rail 13 which is connected to the 12 V terminal 14. The emitter of a high voltage PNP bipolar transistor 15 is also connected to the voltage rail 13. The drain of the high voltage PFET 11 is connected to a well, and the base of the high voltage bipolar transistor 15 is connected to the drain of the PFET 11. The collector of bipolar transistor 15 and the source of the high voltage PFET 11 are connected in common to node 16 which, in turn, is connected to the $V_{cc}$ voltage rail 17. Voltage rail 17 is connected to the 5 V terminal 18.

Using the dual thin oxide PFET 11 for ESD protection networks, the circuit 10 brings 12 V into the NVRAM chip without PNP 15 being forward biased. Moreover, the circuit 10 must bring 12 V into the NVRAM chip without blowing up the high voltage PFET 11 which is accomplished by virtue of a string of diodes in series provided between voltage rail 17 and ground. That is, since most of the chip capacitance is internal to the chip, the p+ diode of the high voltage PNP 15 is followed by a series of p+ diodes, formed by PNP bipolar transistors $14_1$ to $14_5$ to the $V_{dd}$ supply rail 19 connected to terminal 20. As with the high voltage PFET 11, the PNP bipolar transistors $14_1$ to $14_5$ can be formed in N-wells formed in a thick p-epitaxial layer. A low voltage PNP bipolar transistor 101 is used as a snubber diode placed across the p+ diode string $14_1$ to $14_5$ to eliminate Darlington amplification from $V_{cc}$ to $V_{dd}$. A $V_{cc}$–$V_{dd}$ clamp 102 is provided composed of a low voltage p-channel MOSFET structure 12 in combination with an n-channel junction transistor 103. The low voltage p-channel MOSFET structure 12 is located in an N-well having a gate connected to the 5 V voltage rail 17 and having a source connected to the $V_{dd}$ voltage rail 19.

An n-channel field effect transistor (NFET) 21 serves as a clamp between the $V_{dd}$ voltage rail 19 and the substrate voltage rail ($V_{ss}$) 22 connected to terminal 23. NFET 21 can have a thin or thick gate oxide dielectric layer, depending on the manufacturing process.

This basic inventive dual thin oxide ESD network 10 permits application of a high voltage PFET for 12 V NVRAM applications. Other advantages of this invention are that the circuit 10 permits discharge to the 5V voltage rail without overcharging the circuit. Also, the circuit 10 achieves $V_{pp}$ protection and it is sequence independent. Additionally, inventive circuit 10 is useful for pins on all circuits for I/O in NVRAM or, alternatively, in embedded core applications such as EEPROM.

Figure 1B:
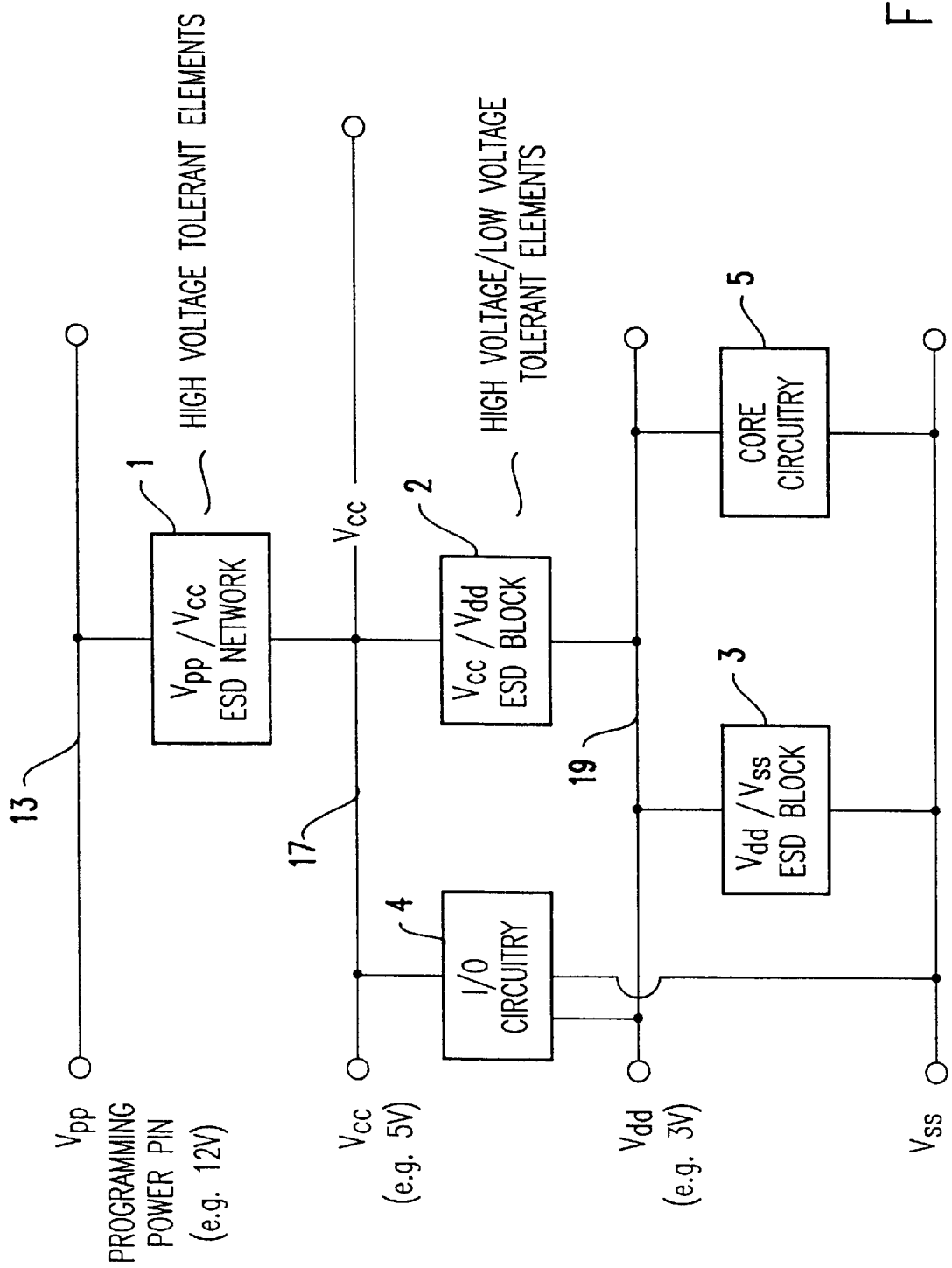
FIG. 1B is a block diagram of the equivalent circuit illustrating the principal components of the ESD protective network shown in FIG. 1A.

FIG. 1B is a block diagram illustrating the three principle components of the ESD network shown in FIG. 1A. The first component is the $V_{pp}/V_{cc}$ EDS network 1 which, as shown in FIG. 1A, is composed of the dual thin oxide PFET 11 and PNP bipolar transistor 15. The second component is the $V_{cc}/V_{dd}$ ESD block network 2 composed of high voltage/low voltage tolerant elements. These include snubber 101, the claim 102 and the string of p+ diodes shown in FIG. 1A. The third component is the $V_{dd}/V_{ss}$ ESD block network 3. In FIG. 1A, this is the NFET 21. In a specific application, input/output (I/O) circuitry 4 is connected between rail 17 and rails 19 and 22. The core circuitry 5 of the chip (e.g., the NRAM array) is connected between the rails 19 and 22. In some applications, voltage regulator circuitry (not shown) may be connected between rails 17 and 19 to provide a regulated $V_{dd}$.

An exemplary method for fabricating the various PFET and NFET devices used in the inventive ESD circuit will now be described.

Referring to FIGS. 2A–2L, there is shown a representative portion of MOSFET devices used in the circuit 10 of the present invention at various stages of its fabrication. In particular, the fabrication routine results in a CMOS structure that can be used in conjunction with a NVRAM device, which is illustrated herein as an EEPROM. It will be understood that the utility of the inventive circuit is not necessarily limited to ESD protection of any particular type of NVRAM, but for purposes of illustration is described in conjunction with embedded core devices such as EEPROMs. Also, the cross-sectional views depicted in FIGS. 2A–2L are for illustrative purposes only and should not be construed as necessarily being to scale. As will be appreciated, the completed MOSFET devices will be electrically associated with each other and other electrical components in the manner shown by circuit 10 in FIG. 1A.

Figure 2A:
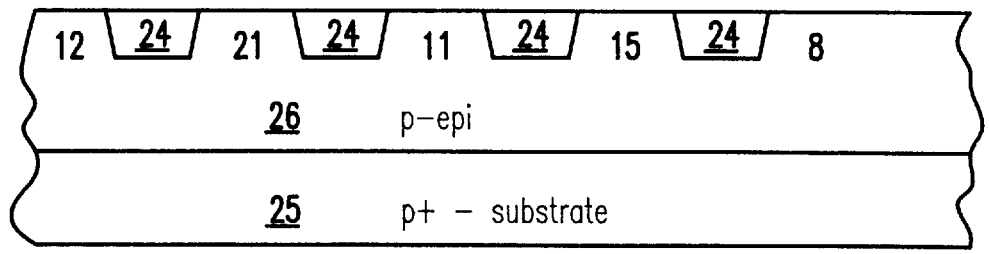
FIGS. 2A–2L illustrate enlarged, cross-sectional views of MOSFET devices used in the inventive ESD circuit shown in FIG. 1A during various steps of an exemplary fabrication scheme of the present invention.

The fabrication method itself includes an initial step of epitaxially forming a p-epi silicon layer 25 at a thickness of approximately 2.5 μm on a p+ silicon substrate 26. This is a relatively thick p-epi layer in that a conventional p-epi layer used as a substrate for forming CMOS devices is only about 2 μm thick. As shown in FIG. 2A, shallow trench isolations (STI) 24 are formed by conventional etching and trench filling methods in the p-epitaxial silicon layer 26 to define the ultimate device areas for low voltage PFET 12, low voltage NFET 21, high voltage PFET 11, high voltage NFET 15 per FIG. 1A, as well as an EEPROM region 8. Alternatively, ROX oxide isolation can be used such as formed by conventional LOCOS techniques.

Figure 2B:
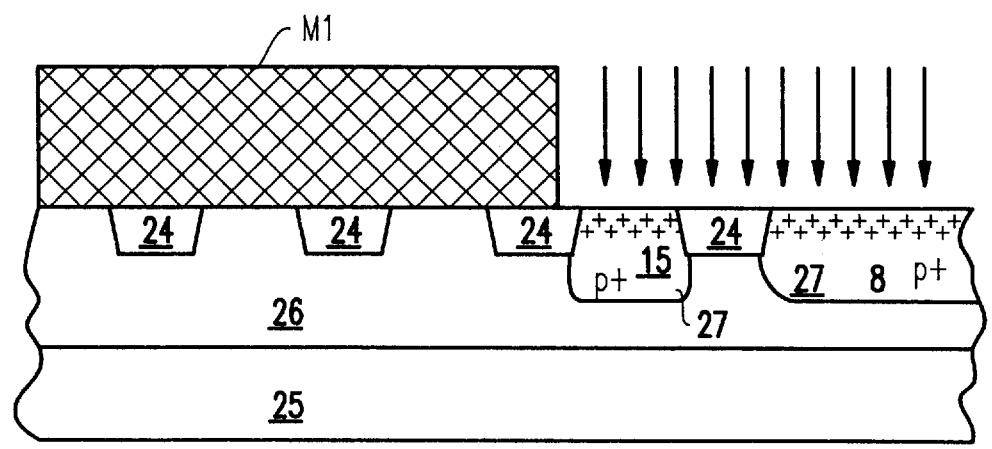

Next, as shown in FIG. 2B, p+ wells 27 are formed for the high voltage NFET 15 and EEPROM cell 8 in p-epi layer 22 using a mask MI by implanting boron species at a dosage of 2.0 E+12 atoms/cm² at 54 KeV. After stripping mask M1, tunnel oxide (not shown) is formed and defined for EEPROM cell 8 by conventional methods. Amorphous polysilicon layer 29 is formed on EEPROM region 8, and polysilicon layer 29 is implanted with phosphorus to a dosage of 1.0E+15 atoms/cm² at 12 KeV.

Figure 2C:
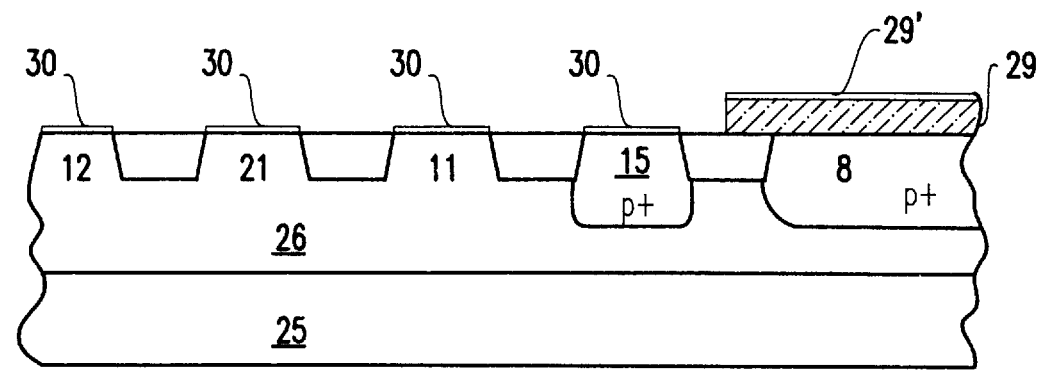
Figure 2D:
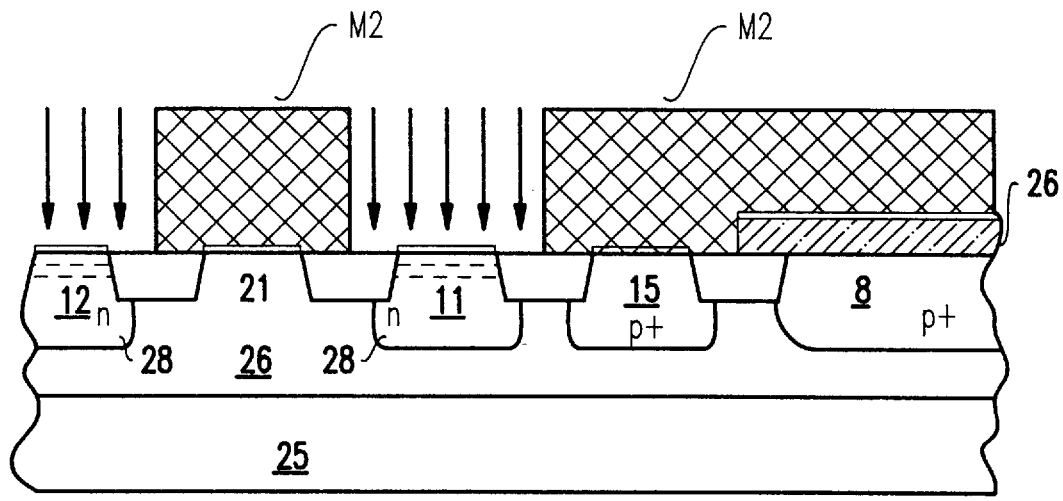

A sacrificial oxide layer 30 having a thickness of about 140–200 Å is then formed over device areas 17, 21, 11 and 15 while EEPROM cell 8 is masked by mask 29' on doped polysilicon layer 29, as shown in FIG. 2C. Next, as shown in FIG. 2D, N-wells 28 are formed for low voltage PFET 12 and high voltage PFET 11 by implanting antimony species at a dosage of 5.1E+12 atoms/cm² at 220 KeV using photolithographical patterning mask M2. During this implantation step, the N-well needed for the NPN bipolar transistors $14_1$ to $14_5$ (not shown in FIG. 2D) can be concurrently formed in the thick p-epitaxial layer 26, or, alternatively, a separate implantation step can be provided to form the N-well used for preparing the NPN bipolar transistors $14_1$ to $14_5$. The diode string $14_1$ to $14_5$ can use deep or shallow p+ implant. The diode string does use the thick epitaxial film 26 for improved ESD robustness.

Figure 2E:
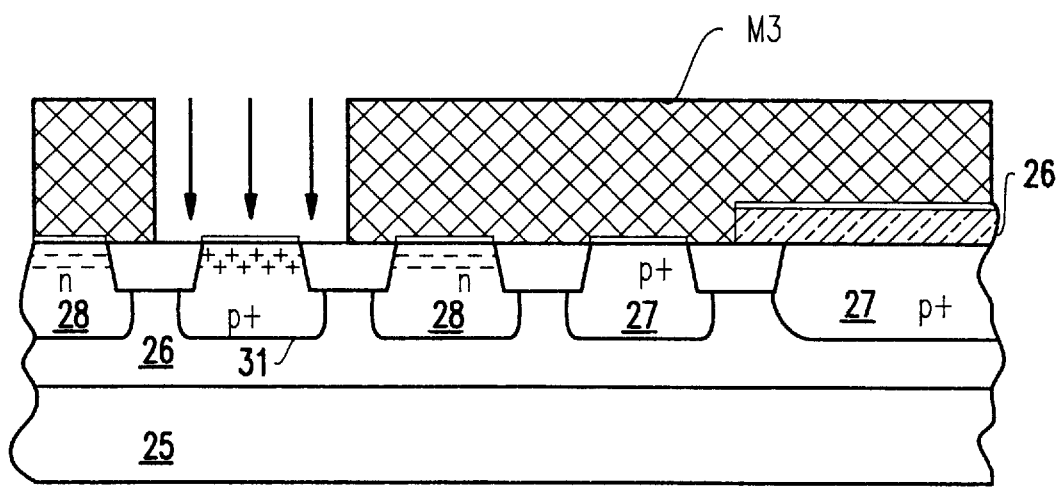

Next, as shown in FIG. 2E, boron species are implanted at a dosage of 8.0E+12 atoms/cm² at 200 KeV through an opening formed in mask M3 to form p+ well 31 for the low voltage NFET 21. The sacrificial oxide 30 is then etched from above the low voltage PFET 12 and low voltage NFET 21 while masking other surface areas across the wafer.

Figure 2F:
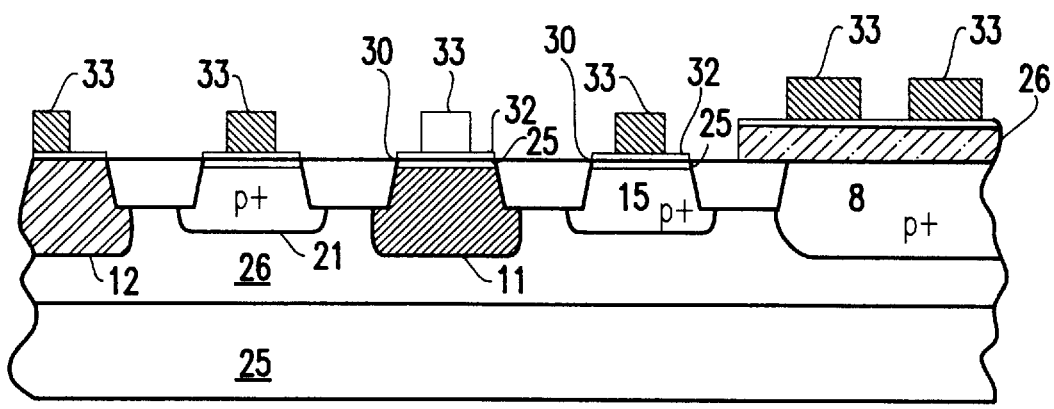

Then, as indicated in FIG. 2F, gate oxide 32 is formed at a thickness of 10–70 Å over the sacrificial oxide 30 at high voltage PFET device 11 and high voltage NFET device 15, as well as directly over the exposed surface of low voltage PFET 12 and low voltage NFET 21. The total dielectric oxide thickness comprised of the gate oxide 32 and sacrificial oxide 30 preferably is about 210 Å for high voltage PFET device 11 and high voltage NFET device 15, Next, polysilicon gate conductors 33 are formed by conventional methods for each of the FET devices 12, 21, 11 and 15, and for EEPROM region 8, resulting in the intermediate structure as shown in FIG. 2F.

Figure 2G:
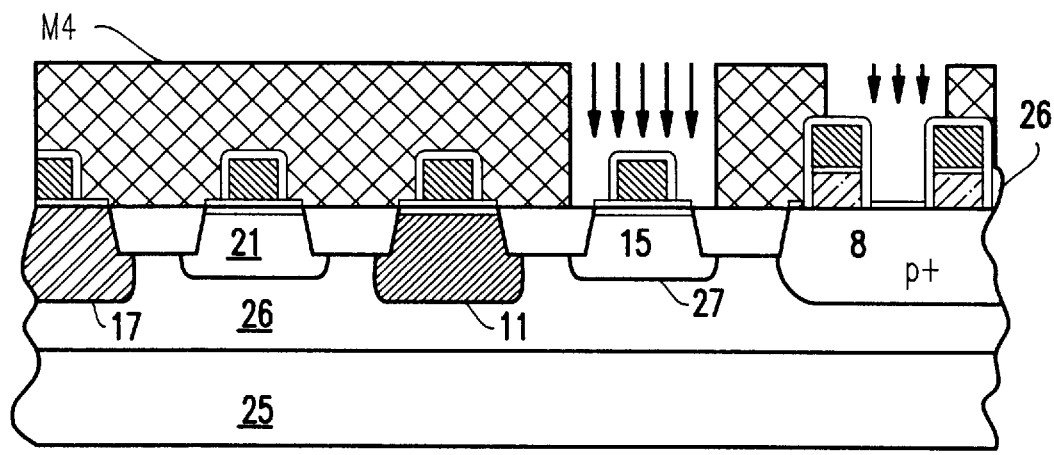

As can be seen in FIG. 2G, polysilicon layer 26 is patterned to define the floating gate of the EEPROM device 8, and then phosphorus doping is implanted in p-well 27 at a dosage of 2.0E+12 atoms/cm² at 85 KeV to form the source and drain regions for the high voltage NFET 15 and the source/drain region for the EEPROM 8, while the rest of the wafer topography is masked with mask M4.

Figure 2H:
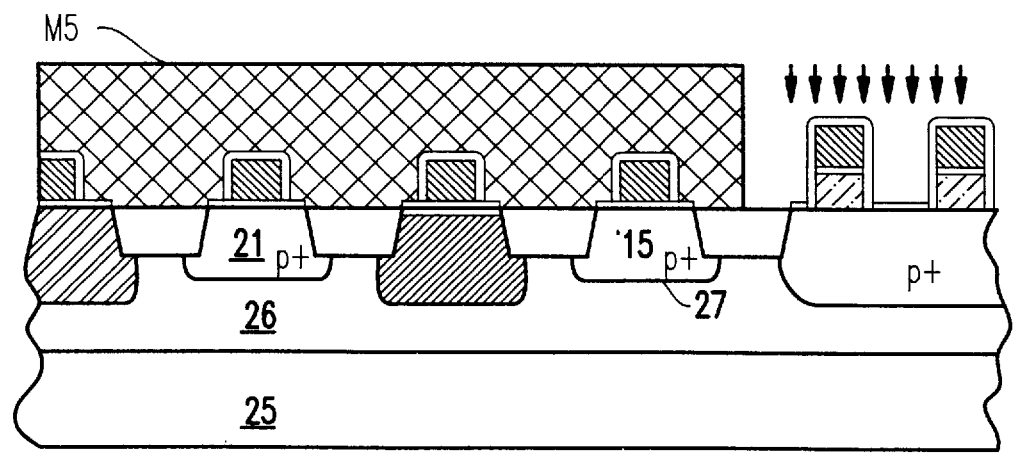

Next, arsenic is doped in the source/drain region of EEPROM 8 at a dosage of 3.0E+15 atoms/cm² at 80 KeV as shown in FIG. 2H, while the rest of the wafer topography is masked with mask M5.

Figure 2I:
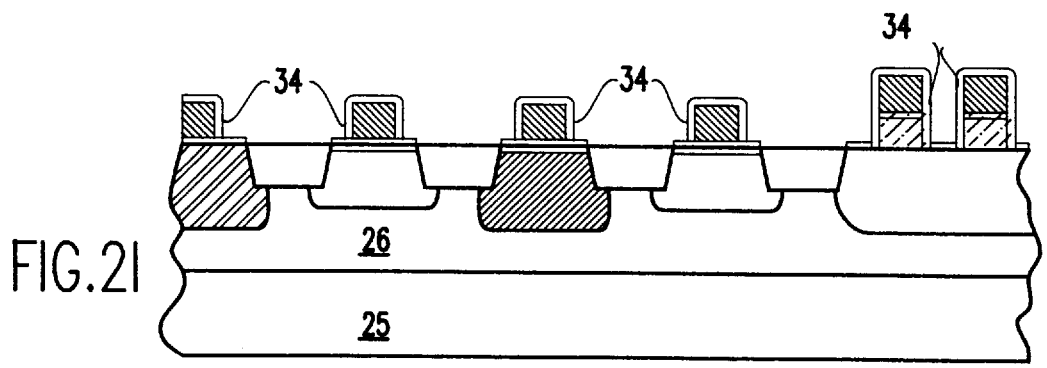
Figure 2J:
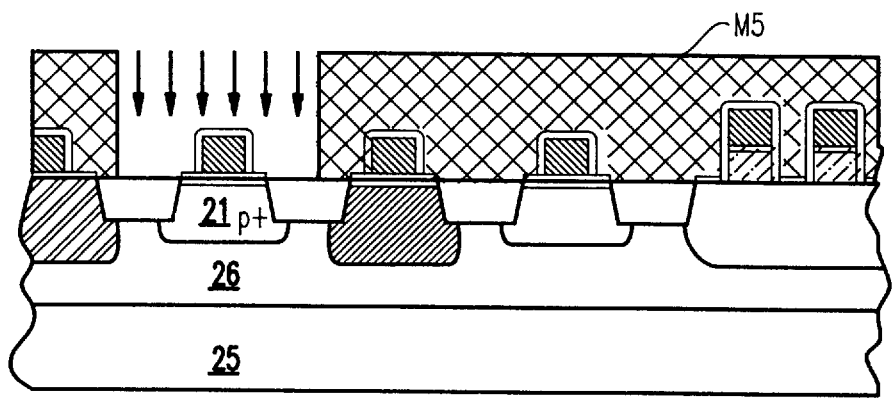
Figure 2K:
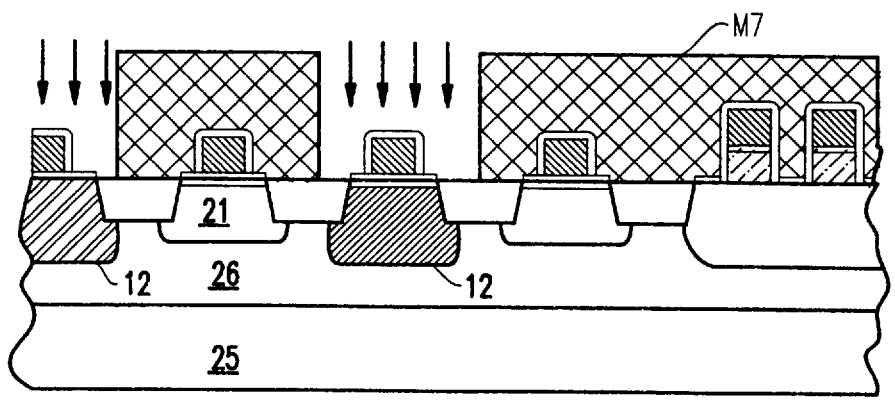
Figure 2L:
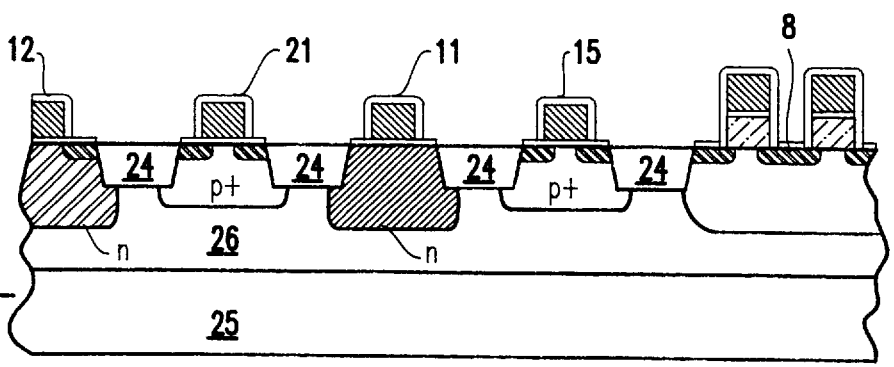

After stripping mask M5, nitride sidewall spacers 34 are formed on the sidewalls of the gate conductors 33 by a conventional methods, as shown in FIG. 2I. Next, as shown in FIG. 2J, source and drain regions are formed for the low voltage NFET 21 using mask M6 by implanting phosphorus at a dosage of 7.5E+14 atoms/cm² at 15 KeV. Next, using mask M7, conventional reach-through p+ implants are provided for the source and drain regions for both the low voltage PFET 12 and the high voltage PFET 11 by implanting germanium species at a dosage of 5.0E+14 atoms/cm² at 40 KeV to form lightly doped drain extensions. Then, deep p+ source and drain regions are provided for both the low voltage PFET 12 and the high voltage PFET 11 in the N-well 28 by implanting boron at a dosage of 4.0E+15 at 11 KeV, as indicated in FIG. 2K. Then the fabricated structure is annealed to provide the completed CMOS and EEPROM structures shown in FIG. 2L. Metal contacts (not shown) and metallization are thereafter formed for the various source and drain regions and gate conductors to provide the circuitry shown in FIG. 1.

Important features and advantages of the inventive circuit include the ability to use a thicker epitaxial layer for NVRAM and ESD; use of a deeper junction for NVRAM and ESD; use of a thick oxide PFET for ESD protection between 12 V and 5 V; use of a thick and a thin oxide ESD protection for protection between 5 V and 3 V; and ESD protection of NVRAM products.

While the invention has been described in terms of a specific embodiment, further modifications and improvements will occur to those skilled in the art. It is to be understood, therefore, that this invention is not limited to any particular forms illustrated and that it is intended in the appended claims to cover all modifications that do not depart from the spirit and scope of this invention.

What is claimed is:

1. A dual thin oxide Electric Static Discharge (ESD) network for nonvolatile memory having a first, second, third and fourth voltage rail for respective voltages $V_{pp}$, $V_{cc}$, $V_{dd}$ and $V_{ss}$ where $V_{pp} < V_{cc} < V_{dd} < V_{ss}$, said ESD network comprising:

a high voltage p-channel device having a dual thin oxide dielectric gate structure connected to the first voltage rail and a drain connected to the second voltage rail;

a high voltage bipolar PNP transistor having an emitter connected to the first voltage rail, a collector connected to the second voltage rail and a base connected to a source of the high voltage p-channel device;

a series of p+ diodes connected between the first and second voltage rails;

a snubber diode connected to the second rail across said series of p+ diodes; and an n-channel device connected between the third and fourth voltage rails.

2. The dual thin oxide ESD network recited in claim 1, further comprising a clamp connected between the first and second voltage rails.

3. The dual thin oxide ESD network recited in claim 1, wherein the series of p+ diodes is constituted by PNP bipolar transistors and the snubber diode acts to prevent Darlington amplification between the second and third voltage rails.

4. The dual thin oxide ESD network recited in claim 3, wherein said high voltage p-channel device and said series of p+ diodes are formed in an n-well, said n-well formed in a p-epitaxial layer having a thickness of about 2.5 μm.

5. The dual thin oxide ESD network recited in claim 1, wherein said high voltage p-channel device has a dual thin oxide dielectric gate structure thickness sufficient to prevent dielectric overstress for the voltage differential $V_{pp} - V_{cc}$.

6. The dual thin oxide ESD network recited in claim 5, wherein $V_{pp}$ is approximately 12 V and $V_{cc}$ is approximately 5 V and wherein said high voltage p-channel device has a dual thin oxide dielectric gate structure thickness of about 200 Å or greater.

* * * * *